United States Patent
Xiong et al.

(10) Patent No.: US 11,737,241 B2
(45) Date of Patent: Aug. 22, 2023

(54) HEAT DISSIPATION APPARATUS, REMOTE RADIO UNIT, BASEBAND PROCESSING UNIT AND BASE STATION

(71) Applicant: Telefonaktiebolaget LM Ericsson (publ), Stockholm (SE)

(72) Inventors: Haigang Xiong, Chengdu (CN); Kai Yang, Chengdu (CN); Bo Xiao, Chengdu (CN); Mengyu Huang, Chengdu (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 14 days.

(21) Appl. No.: 17/636,493

(22) PCT Filed: Aug. 19, 2020

(86) PCT No.: PCT/CN2020/110080
§ 371 (c)(1),
(2) Date: Feb. 18, 2022

(87) PCT Pub. No.: WO2021/032133
PCT Pub. Date: Feb. 25, 2021

(65) Prior Publication Data
US 2022/0304192 A1 Sep. 22, 2022

(30) Foreign Application Priority Data
Aug. 19, 2019 (CN) .......................... 201921344526.6

(51) Int. Cl.
*H05K 7/20* (2006.01)
*H01L 23/367* (2006.01)

(52) U.S. Cl.
CPC ..... *H05K 7/20409* (2013.01); *H01L 23/3672* (2013.01); *H01L 23/3677* (2013.01); *F28F 2215/10* (2013.01)

(58) Field of Classification Search
CPC ............ H05K 7/20409; H05K 7/20418; H01L 23/3672; H01L 23/3677; F28F 2215/10
See application file for complete search history.

(56) References Cited

U.S. PATENT DOCUMENTS

| | | | | |
|---|---|---|---|---|
| 4,369,838 A | * | 1/1983 | Asanuma | ............ H01L 23/4006 257/722 |
| 8,498,116 B2 | * | 7/2013 | Siracki | ................... H05K 7/209 165/185 |

(Continued)

FOREIGN PATENT DOCUMENTS

| | | |
|---|---|---|
| CN | 107438350 A | 12/2017 |
| CN | 210381763 U | 4/2020 |

(Continued)

OTHER PUBLICATIONS

International Search Report and Written Opinion of the International Searching Authority, PCT/CN2020/110080, dated Nov. 20, 2020, 7 pages.

(Continued)

*Primary Examiner* — Zachary Pape
(74) *Attorney, Agent, or Firm* — Sage Patent Group

(57) ABSTRACT

A heat dissipation apparatus, a remote radio unit, a baseband processing unit and a base station are disclosed. According to an embodiment, the heat dissipation apparatus comprises a base and a plurality of first heat sink fins arranged in parallel on the base. On a top of each first heat sink fin of the plurality of first heat sink fins, a first heat dissipation component and a second heat dissipation component are sequentially arranged along the parallel direction of the plurality of first heat sink fins. The first heat dissipation component comprises a bottom plate and a plurality of second heat sink fins which are arranged at intervals along the parallel direction on a top face of the bottom plate. Each (Continued)

second heat sink fin has a shape of a comb having three or more comb teeth.

14 Claims, 3 Drawing Sheets

(56) References Cited

U.S. PATENT DOCUMENTS

| | | | |
|---|---|---|---|
| 2009/0032234 A1* | 2/2009 | Wayman | H01L 23/367 165/185 |
| 2013/0269920 A1 | 10/2013 | Taketomi et al. | |
| 2014/0369054 A1* | 12/2014 | Tsou | F21V 29/767 165/185 |
| 2016/0088770 A1 | 3/2016 | Okuaki | |

FOREIGN PATENT DOCUMENTS

| | | |
|---|---|---|
| EP | 3270674 A1 | 1/2018 |
| GB | 2298995 A | 9/1996 |
| KR | 101164506 B1 | 7/2012 |
| WO | WO 2018/210067 A1 | 11/2018 |

OTHER PUBLICATIONS

Extended European Search Report, EP20855412.1, dated Oct. 14, 2022, 5 pages.
Huang, Z., et al., "Review Of Nature-Inspired Heat Exchanger Technology," International Journal of Refrigeration, Elsevier, Amsterdam, NL, vol. 78, Mar. 8, 2017 (XP085016112) 17 pages.

* cited by examiner

HEAT DISSIPATION APPARATUS, REMOTE RADIO UNIT, BASEBAND PROCESSING UNIT AND BASE STATION

CROSS REFERENCE TO RELATED APPLICATIONS

This application is a 35 U.S.C. § 371 national stage application of PCT International Application No. PCT/CN2020/110080 filed on Aug. 19, 2020, which in turn claims foreign priority to Chinese Patent Application No. 201921344526.6, filed on Aug. 19, 2019, the disclosures and content of which are incorporated by reference herein in their entirety.

TECHNICAL FIELD

Embodiments of the disclosure generally relate to the field of communications, and, more particularly, to a heat dissipation apparatus, a remote radio unit, a baseband processing unit and a base station.

BACKGROUND

This section introduces aspects that may facilitate better understanding of the present disclosure. Accordingly, the statements of this section are to be read in this light and are not to be understood as admissions about what is in the prior art or what is not in the prior art.

With the development of electronic technology, the thermal density of electronic devices is getting higher and higher. An outdoor communication base station is generally provided with a plurality of base station modules, such as a remote radio unit, a baseband processing unit and a power module. Currently, modules of an outdoor communication base station still generally utilize natural environment to dissipate heat with natural cooling as a main solution. FIG. 1 illustrates one such solution. As shown in FIG. 1, the base of the heat sink is in contact with the printed circuit board (PCB) on which a heat source (e.g. a processor, a chip, etc.) is mounted. A plurality of (e.g. elongated) upright heat sink fins are arranged on the base. Air can go through the space between the heat sink fins. The designer may change the number and the thickness of the heat sink fins to improve the heat dissipation efficiency. However, the obtained heat dissipation efficiency is still low.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One of the objects of the disclosure is to provide an improved heat dissipation apparatus.

According to a first aspect of the disclosure, there is provided a heat dissipation apparatus. The heat dissipation apparatus may comprise a base and a plurality of first heat sink fins arranged in parallel on the base. On a top of each first heat sink fin of the plurality of first heat sink fins, a first heat dissipation component and a second heat dissipation component may be sequentially arranged along the parallel direction of the plurality of first heat sink fins. The first heat dissipation component may comprise a bottom plate and a plurality of second heat sink fins which are arranged at intervals along the parallel direction on a top face of the bottom plate. Each second heat sink fin may have a shape of a comb having three or more comb teeth. The second heat dissipation component may comprise a plurality of third heat sink fins which are arranged at intervals along the parallel direction. Each third heat sink fin may have a shape of a comb having three or more comb teeth.

With the above first aspect, since the first heat dissipation component is arranged, a stack effect can be formed by the first heat dissipation component together with the base and the first heat sink fins, such that the velocity of airflow is increased to enhance the heat dissipation efficiency. In addition, since the second heat dissipation component is further arranged, air can flow through the hollowed-out portions between the third heat sink fins to also enhance the heat dissipation efficiency.

In an embodiment of the disclosure, a gap may be provided between the first and second heat dissipation components corresponding to each first heat sink fin and the first and second heat dissipation components corresponding to an adjacent first heat sink fin that is adjacent to the first heat sink fin.

In an embodiment of the disclosure, an extending length of the first heat dissipation component in the parallel direction may be less than an extending length of the second heat dissipation component in the parallel direction.

In an embodiment of the disclosure, the bottom plate may be arranged perpendicular to the first heat sink fin.

In an embodiment of the disclosure, the plurality of comb teeth of each second heat sink fin may be arranged on the bottom plate at intervals in a direction forming a first predetermined angle with the parallel direction.

In an embodiment of the disclosure, the first predetermined angle may be 90 degrees.

In an embodiment of the disclosure, the comb teeth of each second heat sink fin may form a second predetermined angle with the bottom plate.

In an embodiment of the disclosure, the second predetermined angle may be 90 degrees.

In an embodiment of the disclosure, each third heat sink fin may extend in a direction forming a third predetermined angle with the parallel direction and may be arranged to be spaced apart from an adjacent third heat sink fin on a plane in which the bottom plate is located.

In an embodiment of the disclosure, the third predetermined angle may be 90 degrees.

In an embodiment of the disclosure, the comb teeth of each third heat sink fin may form a fourth predetermined angle with a plane in which the bottom plate is located.

In an embodiment of the disclosure, the fourth predetermined angle may be 90 degrees.

According to a second aspect of the disclosure, there is provided a remote radio unit. The remote radio unit may comprise a heat dissipation apparatus according to the above first aspect.

According to a third aspect of the disclosure, there is provided a baseband processing unit. The baseband processing unit may comprise a heat dissipation apparatus according to the above first aspect.

According to a fourth aspect of the disclosure, there is provided a base station. The base station may comprise a heat dissipation apparatus according to the above first aspect.

BRIEF DESCRIPTION OF THE DRAWINGS

These and other objects, features and advantages of the disclosure will become apparent from the following detailed description of illustrative embodiments thereof, which are to be read in connection with the accompanying drawings. Apparently, the schematic structure diagrams in the following drawings are not necessarily drawn to scale, but exhibit various features in a simplified form. Furthermore, the drawings in the following description relate merely to some embodiments of the disclosure, but should not be construed as limiting the disclosure.

DETAILED DESCRIPTION

For the purpose of explanation, details are set forth in the following description in order to provide a thorough understanding of the embodiments disclosed. It is apparent, however, to those skilled in the art that the embodiments may be implemented without these specific details or with an equivalent arrangement.

Figure 2:
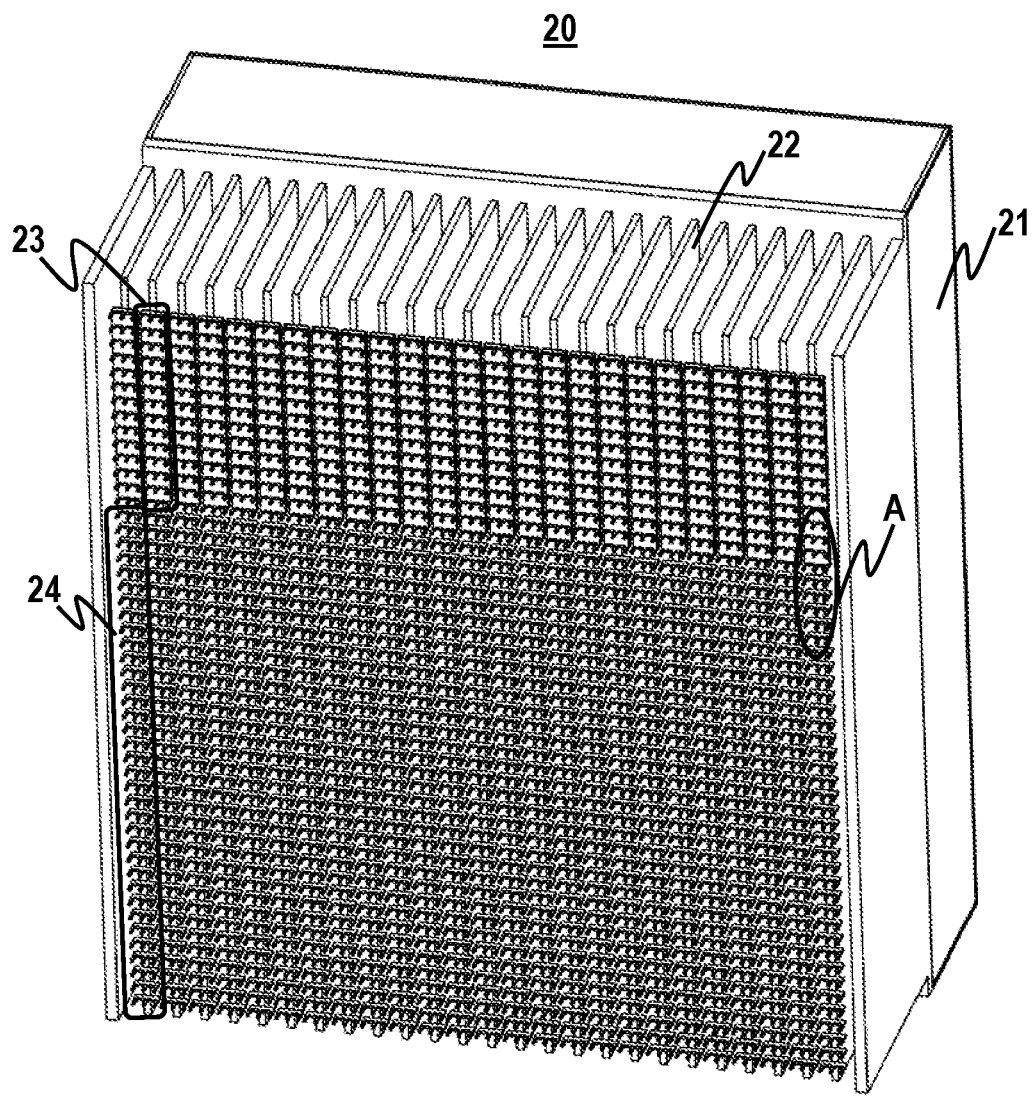
FIG. 2 is a perspective view of a heat dissipation apparatus according to an embodiment of the disclosure.
Figure 3:
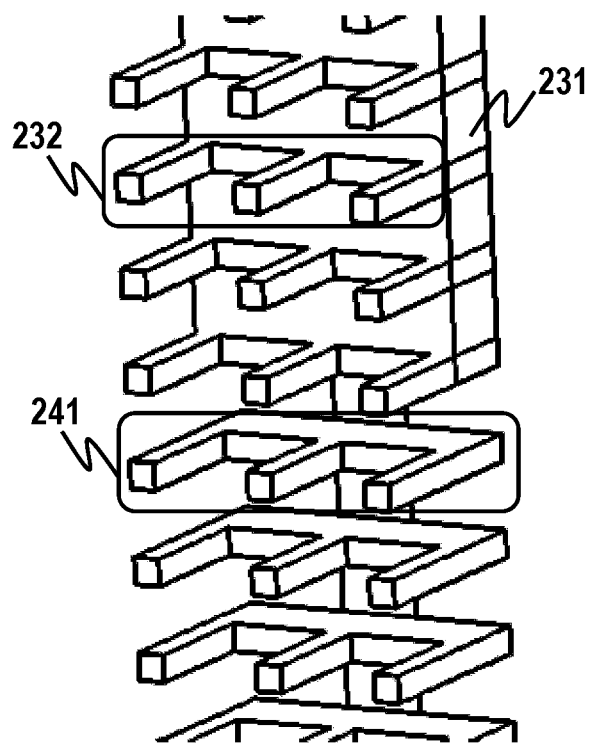
FIG. 3 is a partially enlarged perspective view of a heat dissipation apparatus according to an embodiment of the disclosure.

FIG. 2 is a perspective view of a heat dissipation apparatus according to an embodiment of the disclosure. FIG. 3 is a partially enlarged perspective view of the heat dissipation apparatus shown in FIG. 2. As shown in FIG. 2, the heat dissipation apparatus 20 may comprise a base 21 and a plurality of first heat sink fins 22 arranged in parallel on the base 21. The term "parallel" may refer to that the plurality of first heat sink fins 22 are parallel to each other, and may also refer to that the plurality of first heat sink fins 22 form a certain non-zero angle with each other and do not intersect each other. The main function of the first heat sink fins 22 is to conduct heat from the base 21 to the outside and exchange heat with the air between the first heat sink fins 22. On a top of each first heat sink fin 22 of the plurality of first heat sink fins 22, a first heat dissipation component 23 and a second heat dissipation component 24 may be sequentially arranged along the parallel direction of the plurality of first heat sink fins 22.

As shown in FIG. 3, the first heat dissipation component 23 may comprise a bottom plate 231 and a plurality of second heat sink fins 232 which are arranged at intervals along the parallel direction on a top face of the bottom plate 231. The bottom plate 231 may be arranged perpendicular to the first heat sink fins 22. Each second heat sink fin 232 may have a shape of a comb having three comb teeth. The plurality of comb teeth of each second heat sink fin 232 may be arranged on the bottom plate 231 at intervals in a direction perpendicular to the parallel direction. The comb teeth of each second heat sink fin 232 may be perpendicular to the bottom plate 231. Since the first heat dissipation component is arranged, a stack effect can be formed by the first heat dissipation component together with the base and the first heat sink fins, such that the velocity of airflow is increased to enhance the heat dissipation efficiency.

As shown in FIG. 3, the second heat dissipation component 24 may comprise a plurality of third heat sink fins 241 which are arranged at intervals along the parallel direction. Each third heat sink fin 241 may have a shape of a comb having three comb teeth. The comb teeth of each third heat sink fin 241 may be arranged at intervals in a direction perpendicular to the parallel direction on a plane in which the bottom plate 231 is located. The comb teeth of each third heat sink fin 241 may be perpendicular to a plane in which the bottom plate 231 is located. Since the second heat dissipation component is arranged, air can flow through the hollowed-out portions between the third heat sink fins to enhance the heat dissipation efficiency.

According to the Fourier's Law, the larger the temperature difference is, the higher the heat transfer efficiency is. The top of the first heat sink fin has a larger temperature difference than the bottom of the first heat sink fin, and thus has higher heat dissipation efficiency. Both the first heat dissipation component and the second heat dissipation component increase the area of the top of the first heat sink fin. Consequently, the area with high heat dissipation efficiency can be increased.

Figure 1:
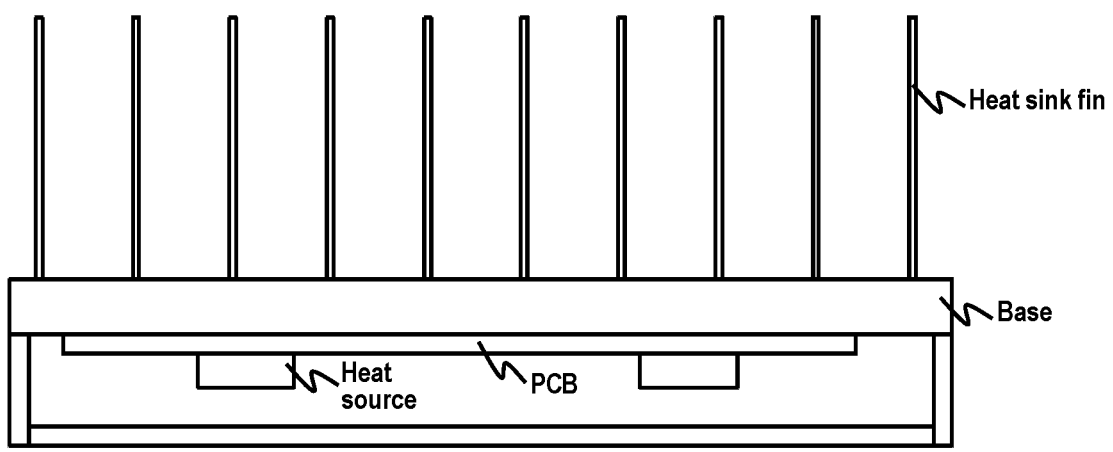
FIG. 1 is a sectional view of an electronic device on which a conventional heat dissipation apparatus is mounted.
Figure 4:
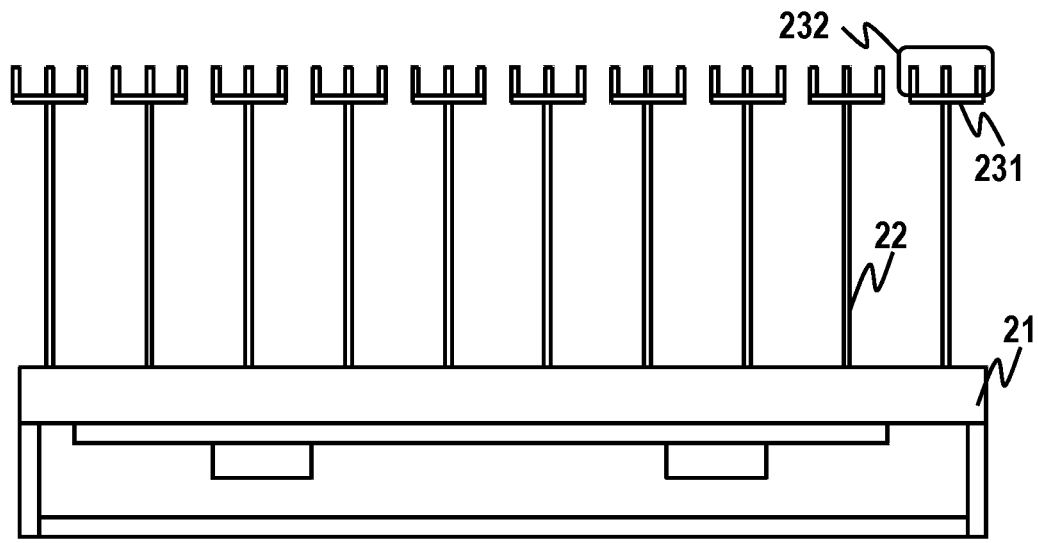
FIG. 4 is a sectional view of an electronic device on which a heat dissipation apparatus according to an embodiment of the disclosure is mounted.

FIG. 4 is a sectional view of an electronic device on which a heat dissipation apparatus according to an embodiment of the disclosure is mounted. For the purpose of illustration and not limitation, it is assumed that the electronic device is the same as that shown in FIG. 1, also containing a PCB on which a heat source is mounted. When the heat dissipation apparatus is cut from above the first heat dissipation component 23 in a direction perpendicular to the base 21, along an imaginary line perpendicular to the parallel direction in FIG. 2, the resulting cross section is as shown in FIG. 4. As can be seen from FIG. 4, a gap may be provided between the first and second heat dissipation components 23, 24 corresponding to each first heat sink fin 22 and the first and second heat dissipation components corresponding to an adjacent first heat sink fin that is adjacent to the first heat sink fin 22.

In designing the heat dissipation apparatus 20, the ratio between the extending length of the first heat dissipation component 23 in the parallel direction and the extending length of the second heat dissipation component 24 in the parallel direction may be adjusted to obtain the optimal heat dissipation efficiency. For example, according to a simulation experiment, the extending length of the first heat dissipation component 23 in the parallel direction may be set to be smaller than the extending length of the second heat dissipation component 24 in the parallel direction, thereby obtaining better heat dissipation efficiency.

However, the present disclosure is not limited to the examples shown in FIGS. 2-4. As another example, the number of comb teeth of each second heat sink fin 232 and/or each third heat sink fin 241 may be three or more (i.e., greater than or equal to three). As still another example, the comb teeth of each second heat sink fin 232 may be arranged at intervals on the bottom plate 231 in a direction forming a first predetermined angle with the parallel direction. The first predetermined angle may be 90 degrees or any other suitable angle. The first predetermined angle of each of the plurality of second heat sink fins 232 may be the same or different with each other. As yet another example, the comb teeth of each second heat sink fin 232 may form a second predetermined angle with the bottom plate 231. The second predetermined angle may be 90 degrees or any other suitable angle. The second predetermined angle of each of the plurality of second heat sink fins 232 and/or the second predetermined angle of each of the comb teeth thereof may be the same or different with each other.

Similarly, as yet another example, each third heat sink fin 241 may extend in a direction forming a third predetermined angle with the parallel direction and is arranged to be spaced apart from an adjacent third heat sink fin on a plane in which the bottom plate 231 is located. The third predetermined angle may be 90 degrees or any other suitable angle. The third predetermined angle of each of the plurality of third heat sink fins 241 may be the same or different with each other. As yet another example, the comb teeth of each third heat sink fin 241 may form a fourth predetermined angle with a plane in which the bottom plate 231 is located. The fourth predetermined angle may be 90 degrees or any other suitable angle. The fourth predetermined angle of each of the plurality of third heat sink fins 241 and/or the fourth predetermined angle of each of the comb teeth thereof may be the same or different with each other. In addition, the intervals between the plurality of second heat sink fins 232 may be the same or different with each other. Similarly, the intervals between the plurality of third heat sink fins 241 may be the same or different with each other.

Based on the above description, at least one embodiment of the present disclosure provides a heat dissipation apparatus. The heat dissipation apparatus comprises a base and a plurality of first heat sink fins arranged in parallel on the base. On a top of each first heat sink fin of the plurality of first heat sink fins, a first heat dissipation component and a second heat dissipation component are sequentially arranged along the parallel direction of the plurality of first heat sink fins. The first heat dissipation component comprises a bottom plate and a plurality of second heat sink fins which are arranged at intervals along the parallel direction on a top face of the bottom plate. Each second heat sink fin has a shape of a comb having three or more comb teeth. The second heat dissipation component comprises a plurality of third heat sink fins which are arranged at intervals along the parallel direction. Each third heat sink fin has a shape of a comb having three or more comb teeth.

As another embodiment, the present disclosure further provides a remote radio unit. The remote radio unit comprises the heat dissipation apparatus described hereinabove. The components of the remote radio unit other than the heat dissipation apparatus may be the same as any existing or future developed remote radio unit and are not described herein again. Since the heat dissipation apparatus described hereinabove can have enhanced heat dissipation efficiency, the temperature of the remote radio unit in which the heat dissipation apparatus is mounted can be effectively reduced.

As yet another embodiment, the present disclosure also provides a baseband processing unit. The baseband processing unit comprises the heat dissipation apparatus described hereinabove. The components of the baseband processing unit other than the heat dissipation apparatus may be the same as any existing or future developed baseband processing unit and are not described herein again. Since the heat dissipation apparatus described hereinabove can have enhanced heat dissipation efficiency, the temperature of the baseband processing unit in which the heat dissipation apparatus is mounted can be effectively reduced.

As yet another embodiment, the present disclosure also provides a base station. The base station comprises the heat dissipation apparatus described hereinabove. The components (e.g. a remote radio unit, a baseband processing unit, a power module, etc.) of the base station other than the heat dissipation apparatus may be the same as any existing or future developed base station and are not described herein again. Since the heat dissipation apparatus described hereinabove can have enhanced heat dissipation efficiency, the temperature of the base station in which the heat dissipation apparatus is mounted can be effectively reduced.

Unless otherwise defined, all terms used herein (including technical and scientific terms) have the same meaning as commonly understood by those skilled in the art. It should be further understood that terms, such as those defined in commonly used dictionaries, should be interpreted as having a meaning that is consistent with their meaning in the context of the specification and the relevant art and should not be interpreted in an ideal or excessively formal sense unless clearly defined in the present disclosure.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. As used herein, the statement that two or more parts are "coupled", "connected" or "cascaded" together shall mean that the parts are joined together either directly or joined through one or more intermediate parts.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

References in the present disclosure to "one embodiment", "an embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It is to be understood that the orientation or position relationships indicated by the terms such as "top", "bottom", "inner", "outer", etc. are the orientation or position relationships based on the drawings, which are only used to facilitate the description of the present disclosure or simplify the description, and are not intended to indicate or suggest that the members, components or apparatuses should have the specific orientations, or should be manufactured and operated in the specific orientations. Therefore, the terms should not be construed as limiting the present disclosure.

As used herein, the term "examples" particularly when followed by a listing of terms is merely exemplary and illustrative, and should not be deemed to be exclusive. It should be noted that various aspects of the present disclosure may be implemented individually or in combination with one or more other aspects. Furthermore, the detailed description and specific embodiments are intended for purposes of illustration only and are not intended to limit the scope of the disclosure.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-limiting and exemplary embodiments of this disclosure.

What is claimed is:

1. A heat dissipation apparatus comprising:
   a base and a plurality of first heat sink fins arranged in parallel on the base;
   characterized in that:
   on a top of each first heat sink fin of the plurality of first heat sink fins, a first heat dissipation component and a second heat dissipation component are sequentially arranged along the parallel direction of the plurality of first heat sink fins;
   the first heat dissipation component comprises a bottom plate and a plurality of second heat sink fins which are arranged at intervals along the parallel direction on a top face of the bottom plate, wherein each second heat sink fin has a shape of a comb having three or more comb teeth; and
   the second heat dissipation component comprises a plurality of third heat sink fins which are arranged at intervals along the parallel direction, wherein each third heat sink fin has a shape of a comb having three or more comb teeth.

2. The heat dissipation apparatus according to claim 1, characterized in that, a gap is provided between the first and second heat dissipation components corresponding to each first heat sink fin and the first and second heat dissipation components corresponding to an adjacent first heat sink fin that is adjacent to the first heat sink fin.

3. The heat dissipation apparatus according to claim 1, characterized in that, an extending length of the first heat dissipation component in the parallel direction is less than an extending length of the second heat dissipation component in the parallel direction.

4. The heat dissipation apparatus according to claim 1, characterized in that, the bottom plate is arranged perpendicular to the first heat sink fin.

5. The heat dissipation apparatus according to claim 1, characterized in that, the plurality of comb teeth of each second heat sink fin are arranged on the bottom plate at intervals in a direction forming a first predetermined angle with the parallel direction.

6. The heat dissipation apparatus according to claim 5, characterized in that, the first predetermined angle is 90 degrees.

7. The heat dissipation apparatus according to claim 1, characterized in that, the comb teeth of each second heat sink fin form a second predetermined angle with the bottom plate.

8. The heat dissipation apparatus according to claim 7, characterized in that, the second predetermined angle is 90 degrees.

9. The heat dissipation apparatus according to claim 1, characterized in that, each third heat sink fin extends in a direction forming a third predetermined angle with the parallel direction and is arranged to be spaced apart from an adjacent third heat sink fin on a plane in which the bottom plate is located.

10. The heat dissipation apparatus according to claim 9, characterized in that, the third predetermined angle is 90 degrees.

11. The heat dissipation apparatus according to claim 1, characterized in that, the comb teeth of each third heat sink fin form a fourth predetermined angle with a plane in which the bottom plate is located.

12. The heat dissipation apparatus according to claim 11, characterized in that, the fourth predetermined angle is 90 degrees.

13. A remote radio unit, characterized in that, the remote radio unit comprises the heat dissipation apparatus according to claim 1.

14. A baseband processing unit, characterized in that, the baseband processing unit comprises the heat dissipation apparatus according to claim 1.

* * * * *